United States Patent

Louagie et al.

[11] Patent Number: 5,861,778
[45] Date of Patent: Jan. 19, 1999

[54] LOW NOISE AMPLIFIER STRUCTURE

[75] Inventors: Filip Marcel Louagie, Roeselare; Jean-Philippe Robert Cornil, Enghien, both of Belgium

[73] Assignee: Alcatel Alsthom Compagnie Generale d'Electricite, Paris, France

[21] Appl. No.: 925,509

[22] Filed: Sep. 8, 1997

[30] Foreign Application Priority Data

Sep. 13, 1996 [EP] European Pat. Off. ............. 96202548

[51] Int. Cl.$^6$ ................................ H03F 3/45; H03F 3/68; H03G 3/30
[52] U.S. Cl. ............................ 330/260; 330/84; 330/254; 330/258
[58] Field of Search ........................ 330/69, 84, 124 R, 330/254, 258, 260, 295

[56] References Cited

U.S. PATENT DOCUMENTS 5,327,098  7/1994  Molina et al. ......................... 330/254
5,339,285  8/1994  Straw ..................................... 367/135

OTHER PUBLICATIONS

"A 3.3–V 800–n $V_{rms}$ Noise, Gain –Programmable CMOS Microphone Preamplifier Designs Using Yield Modeling Technique", G. Nicollini et al, *IEEE Journal of Solid–State Circuits*, vol. 28, No. 8, Aug. 1993, pp. 915–921.

"A Versatile Building Block: The CMOS Differential Difference Amplifier", E. Sackinger et al, *IEEE Journal of Solid–State Circuits*, vol. SC–22, No. 2, Apr. 1987, pp. 287–294.

*Primary Examiner*—James B. Mullins
*Attorney, Agent, or Firm*—Ware, Fressola, Van Der Sluys & Adolphson LLP

[57] ABSTRACT

A low noise amplifier structure based on a Differential Difference Amplifier (DDA1) having a differential output (outp, outn) and two differential pairs of input terminals (N1, P1; N2, P2). The input signal ($V_{IN}$) is applied to terminals (N2, P1) which belong to different differential pairs. In this way, none of the differential pairs receives a high input signal, and hence none of them cause unacceptable harmonic distortion. The dynamic input range is thus high. The gain of the structure is determined by a resistive circuit (R2a, R2a'; R2b, R2b') coupled to the remaining terminals (N1, P2) of the differential pairs. The common mode of these remaining terminals (N1, P2) is, independently from the output common mode, biased at the input common mode via a common mode feedback circuit (DDA2; GL1, GH1, GH3, R2a, R2a'; GL2, GH2, GH4, R2b, R2b') based on a second differential difference amplifier (DDA2). Some switching elements (GL1, GH1, GH3; GL2, GH2, GH4) allow the gain to be programmed and prevent the common mode feedback circuit from injecting differential noise if the gain is high. The structure is adapted to amplify signals of 1 Vpp with acceptably low distortion.

8 Claims, 1 Drawing Sheet

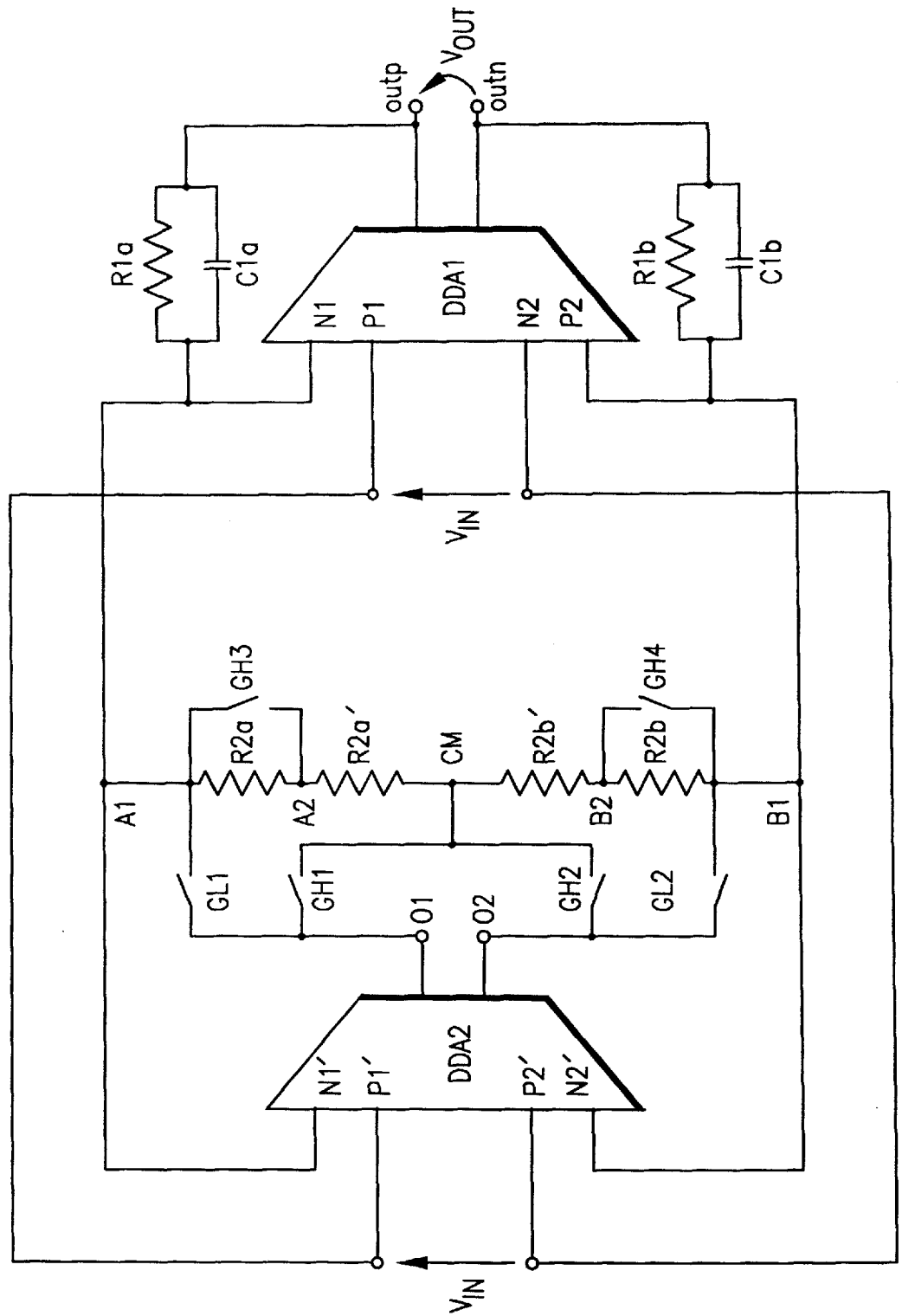

LOW NOISE AMPLIFIER STRUCTURE

BACKGROUND OF THE INVENTION

1. Technical Field

The present invention relates to a low noise amplifier structure dapted to amplify an input signal applied to input terminals thereof to thereby generate an output signal at an output thereof, said structure including:

a differential difference amplifier having said output and a plurality of input terminals arranged in a first and in a second differential input pair, said first differential input pair comprising a first input terminal of a first polarity type and a second input terminal of a second polarity type opposite to said first polarity type, and said second differential input pair comprising a third input terminal of said first polarity type and a fourth input terminal of said second polarity type; and a feedback structure including first feedback means (R1a, C1a; R1b, C1b) coupled between said output and at least one input terminal among said plurality and second feedback means (R2a, R2a'; R2b, R2b') coupled between said one input terminal and a common node, said input signal being applied to a set of two input terminals among said plurality and different from said one input terminal.

2. Discussion of Related Art

Such a low noise amplifier structure is already known in the art, e.g. from the article "A 3.3-V 800-nVrms Noise, Gain-Programmable CMOS Microphone Preamplifier Design Using Yield Modeling Technique" by G. Nicollini et al. of SGS-Thomson Microelectronics, and published in the IEEE JOURNAL OF SOLID-STATE CIRCUITS, VOL. 28, NO. 8, Aug. 1993, pages 915 to 921. Therein, different amplifier arrangements are compared in order to obtain a low noise amplifier structure with a high resistive input impedance and a wide input common mode range. It has been proved that the best structure is based on the use of a "Differential Difference Amplifier" (DDA). In this best known structure, the input signal is applied to the first differential input pair of the amplifier. The first feedback means of the feedback structure which controls the gain of the amplifier, is constituted by a first resistor connected between the output and an input terminal of the second differential input pair, while the second feedback means is constituted by a second resistor connected between the latter input terminal and the common node which, in this case, is the ground. The other input terminal of the second differential input pair is also connected to the common node, i.e. to the ground.

A problem with this known low noise single ended amplifier structure is that an unacceptable distortion appears in the output signal when the amplitude of the input signal becomes relatively high, e.g. in the range of 1 Vpp. In the article, the amplitude of the input signal is limited to 100 mV.

The reason thereof is that the dynamic range of a single differential input pair is insufficiently high. This dynamic range can for instance be enlarged by decreasing the Width-to-Length ratio (W/L) of the input transistors of the differential input pair. However, smaller transistors result in more input referred noise which is not recommended for low noise amplifiers.

SUMMARY OF INVENTION.

An object of the present invention is to provide a low noise amplifier structure of the above known type with a high resistive input impedance, a wider input common mode range and which operates in a fully differential way.

According to the invention, this object is achieved due to the fact that said input signal is applied between said second and said third input terminals of opposite polarity types of said first and second differential input pairs respectively, that said output is a differential output comprising a first output terminal and a second output terminal, that said first feedback means comprises a first feedback circuit coupling said first output terminal to said first input terminal of said first differential input pair, and a second feedback circuit coupling said second output terminal to said fourth input terminal of said second differential input pair, and that said second feedback means comprises a third feedback circuit coupling said first input terminal to said common node, and a fourth feedback circuit coupling said fourth input terminal to said common node.

In this way, a fully differential amplifier structure with a high input impedance and a wide range for input common mode is obtained. Indeed, the input signal is applied to input terminals which belong to different differential input pairs of the differential difference amplifier. As a result, none of the differential pairs receive a high input signal, and hence none of them cause unacceptable harmonic distortion. The dynamic input range increases thereby significantly. The input impedance is determined by the input transistors of the differential difference amplifier and has therefore a relatively high resistive value. The gain of this structure is determined by the ratios of the feedback circuits coupled to the first and fourth input terminals of the differential difference amplifier.

To even more increase the input common mode range, another characteristic feature of the present invention is that said structure further includes input common mode adjustment means comprising a second differential difference amplifier and a resistive feedback network, that said second differential difference amplifier has a second differential output comprising a third output terminal and a fourth output terminal, and has a second plurality of input terminals arranged in a third and in a fourth differential input pair, said third differential input pair comprising a fifth input terminal and a sixth input terminal of opposite polarity types, and said fourth differential input pair comprising a seventh input terminal and an eighth input terminal of opposite polarity types, that said sixth and eighth input terminals are connected to said second and third input terminals respectively of the first mentioned differential difference amplifier, and said fifth and seventh input terminals are connected to said first and fourth input terminals respectively of said first differential difference amplifier, and that said resistive feedback network includes said feedback structure (R1a, C1a, R2a, R2a'; R1b, C1, R2, R2') whereof said third feedback circuit and said fourth feedback circuit are resistive means coupling said fifth input terminal to said seventh input terminal via said common node, and is adapted to couple said third and fourth output terminals of said second differential difference amplifier to said first and fourth input terminals respectively of said first differential difference amplifier.

In this way, the input common mode adjustment means sources currents into the first differential difference amplifier whereby the input common mode range of the latter is increased. In other words, the common mode of these input terminals is, independently from the output common mode, biased at the input common mode via the input common mode adjustment means which acts as a common mode feedback circuit based on the second differential difference amplifier, In order to allow the gain of the present structure to be modified, still another characteristic feature thereof is that said resistive feedback network further includes switching means adapted to couple said third and fourth output terminals of said second differential difference amplifier to said first and fourth input terminals of said first differential difference amplifier either directly for a first status of said switching means or via said resistive means for a second status of said switching means.

The present low noise amplifier structure is thereby provided with a programmable gain which can be set low or high according to the status of the switching means.

In more detail, each of said third and fourth feedback circuits include a same plurality of series connected resistors, and said switching means includes:
- a first pair of switches adapted to connect said third and fourth output terminals of said second differential difference amplifier to said first and fourth input terminals of said first differential difference amplifier;
- a second pair of switches adapted to connect said third and fourth output terminals of said second differential difference amplifier to said common node of said third and fourth feedback circuits; and
- at least a third pair of switches, each switch of said third pair being connected across a resistor of a distinct one of said resistive means.

By a suitable control of the switching means, it is thus possible to obtain several different gain modes.

Also another characteristic feature of the present invention is that said first status of said switching means corresponds to a relatively low gain of said structure for which the switches of said first pair of switches are closed, while the switches of said second and third pairs of switches are open, and that said second status of said switching means corresponds to a relatively high gain of said structure for which the switches of said first pair of switches are open, while the switches of said second and third pairs of switches are closed.

Thus, for a high input signal, the gain of the structure is set to low (first status) by opening the switches of the third pair so that the resistive value of the resistive means is maximum, while for a low input signal, the gain is set to high (second status) by closing the switches of the third pair, the resistive value of the resistive means is thereby reduced. Moreover, as will be explained in more detail later, the switching means prevents the resistive feedback network from injecting differential noise in the first differential difference amplifier when the gain is high.

The above mentioned and other objects and features of the invention will become more apparent and the invention itself will be best understood by referring to the following description of an embodiment taken in conjunction with the accompanying figure that repsents a low noise amplifier structure according to the invention.

BRIEF DESCRIPTION OF THE DRAWING

The sole figure shows a fully differential low noise amplifier structure based on a "differential Difference Amplifier" (DDA) topology to assure a high resistive input impedance and a wide input common mode range. It has a builtin programmable gain circuit switchable between 2 dB and 20 dB, hereafter referred to as low gain and high gain mode respectively. The amplifier structure is implemented in a 0.5 $\mu$m standard CMOS technology. It consumes 1.9 mA from a single 3 Volt supply.

DETAILED DESCRIPTION OF PREFERRED EMBODIMENTS

In more detail, the amplifier structure essentially consists of a differential difference amplifier DDA1 associated to feedback circuits R1$a$, C1$a$ and R1$b$, C1$b$. The amplifier DDA1 has two differential input pairs N1, P1 and N2, P2, as well as a differential output pair outp, outn. A complete description of such a differential difference amplifier will not be given in more detail hereafter since it is well known in the art, for instance from the article "A Versatile Building Block: The CMOS Differentiol Difference Amplifier" by E. S äckinger et al., published in the IEEE JOURNAL OF SOLID-STATE CIRCUITS, VOL. SC-22, NO. 2, April 1987, pages 287 to 294.

The feedback circuits are constituted by the parallel connection of a resistor R1$a$; R1$b$ and a capacitor C1$a$; C1$b$ in order to provide low pass filtering. These circuits couple back the terminals outp, outn of the differential output pair to input terminals of the amplifier DDA1. A particularity of the amplifier DDA1 is that the feedback circuit R1$a$, C1$a$ connects the output terminal outp to the inverting input (−) N1 of the first differential input pair N1, P1 of DDA1, while the feedback circuit R1$b$, C1$b$ connects the output terminal outn to the non-inverting input (+) P2 of the second differential input pair N2, P2 of DDA1. An input signal Vin may then be applied to the remaining input terminals P1 and N2 of DDA1, i.e. between the non-inverting input (+) P1 of the first differential input pair N1, P1 and the inverting input (−) N2 of the second differential input pair N2, P2.

The amplifier structure further includes a second differential difference amplifier DDA2 and a resistive feedback network constituted by the series connection of four resistors R2$a$, R2$a$'; R2$b$, R2$b$' and associated switches as will be explained below.

The amplifier DDA2 has two differential input pairs N1', P1' and N2', P2', as well as a differential output pair O1, O2. The inverting input (−) N1' of the first differential input pair N1', P1' of DDA2 is connected to the inverting input (−) N1 of the first differential input pair N1, P1 of DDA1, via a feedback node A1, while the inverting input (−) N2' of the second differential input pair N2', P2' of DDA2 is connected to the non-inverting input (+) P2 of the second differential input pair N2, P2 of DDA1, via a feedback node B1. Furthermore, the non-inverting input (+) P1' of the first differential input pair N1', P1' of DDA2 is connected to the non-inverting input (+) P1 of the first differential input pair N1, P1 of DDA1, while the non-inverting input (+) P2' of the second differential input pair N2', P2' of DDA2 is connected to the inverting input (−) N2 of the second differential input pair N2, P2 of DDA1. As a consequence, the input signal Vin is also between the non-inverting (+) input terminals P1' and P2' of DDA2.

The resistors R2$a$, R2$a$'; R2$b$, R2$b$' of the resistive feedback network are connected in series between the terminals A1 and B1. The outputs O1 and O2 of DDA2 are coupled to the nodes A1 and B1 via switches GL1 and GL2, and to a common node CM linking the resistors R2$a$' and R2$b$' via switches GH1 and GH2, respectively. Other switches GH3 and GH4 are coupled across the resistors R2$a$ and R2$b$ respectively, i.e. between the nodes A1 and A2, and B1 and B2, the node A2 linking R2$a$ to R2$a$' and the node B2 linking R2$b$ to R2$b$'.

The differential input resistance of the amplifier structure is substantially infinite. The DC gain is easily calculated as R1+R2/R2, with R1 being equal to the resistive value of the identical resistors R1$a$ or R1$b$, and with R2 being equal to the resistive value of R2$a$+R2$a$' or its equivalent R2$b$+R2$b$', when the switches GH3 and GH4 are open.

The second amplifier DDA2 forces the common mode of the feedback nodes A1 and B1 of DDA1 to be equal to the common mode of the differential input signal Vin. Therefore, DDA2 sources currents I1 and I2 into the resistive feedback network.

The status of the switches determine the gain mode of the amplifier. In the high gain mode (20 dB), used for a low input signal Vin, the switches GH1, GH2, GH3 and GH4 are all closed, while the switches GL1 and GL2 are open. In this high gain mode the output current of DDA2 for the common mode adjust is injected in the common node CM. This makes the noise generated by DDA2 a common mode noise, and thus unimportant to the differential output signal. This results in a minimum input referred noise.

To switch the gain to the low mode (2 dB), i.e. for a larger input signal Vin, the switches GH3 and GH4 are opened. An extra resistor R2a/R2b is thereby inserted in the feedback network. However, injecting the common mode adjust current in the node CM results in problems of dynamic range of the output stage of the amplifier DDA2. Therefore, the switches GH1 and GH2 are then also opened and the switches GL1 and GL2 are closed. The current is then added directly at the feedback nodes A1 and B1. In this way, the output noise of DDA2 is added differentially to the amplifier output. However, in this low gain configuration the noise is less significant with respect to the input signal which is then much larger.

The internal circuitry of the differential difference amplifiers DDA1 and DDA2 is relatively classical and is therefore not shown in detail. It is however important to note that in the amplifier DDA1, the common mode of the outputs is forced to analog ground which equals half the supply voltage. Furthermore, the input transistors of the differential pairs are dimensioned very large (750 $\mu$m/7.5 $\mu$m) to reduce the noise. The large W/L (Width-to-Length) ratio results in a high transconductance $g_m$, which reduces the input referred noise of the other transistors in DDA1. This is only possible when the input signal is applied across input terminals of different input pairs, i.e. P1 and N2 as in the present case, otherwise the W/L ratio of the input transistors could not be chosen too large in order to allow the processing of reasonable input signals with limited distortion.

In the amplifier DDA2, the output current is determined by the common mode of the input signal Vin applied to the non-inverting inputs P1' and P2' of the two differential pairs. The feedback nodes A1 and B1 of the resistive network are fed-back to the inverting nodes N1' and N2'. This forms a common mode adjust loop. The input common mode range is limited at the lower side, at the common mode of the outputs of DDA1, because the outputs of the common mode adjust DDA2 can only source current. However, the input common mode range could easily be extended at the lower side by adapting the output stage to sink and source current. The input common mode range would then be limited at the lower side by the saturation constraint of the current source of the input differential pairs of both DDA1 and DDA2. As a result, the input common mode range may vary from half the supply voltage up to the so-called upper rail voltage.

It is to be noted that all the above mentioned switches GL1, GH1, GH3 and GL2, GH2, GH4 may be realized by CMOS transistors as it is well known in the art. Furthermore, although the present structure is described with only two possible gain modes, it is relatively easy for a person skilled in the art to extend the design of the resistive feedback network in order to obtain much more possible gain settings, e.g. by increasing the number of resistors and the number of switches across them.

While the principles of the invention have been described above in connection with specific apparatus, it is to be clearly understood that this description is made only by way of example and not as a limitation on the scope of the invention.

We claim:

1. Low noise amplifier structure adapted to amplify an input signal ($V_{IN}$) applied to input terminals thereof to thereby generate an output signal ($V_{OUT}$) at an output (outp; outn) thereof, said structure including:

a differential difference amplifier (DDA1) having said output and a plurality of input terminals (N1, P1; N2, P2) arranged in a first (N1, P1) and in a second (N2, P2) differential input pair, said first differential input pair (N1, p1) comprising a first input terminal (N1) of a first polarity type (−) and a second input terminal (P1) of a second polarity type (+) opposite to said first polarity type, and said second differential input pair (N2, P2) comprising a third input terminal (N2) of said first polarity type (−) and a fourth input terminal (P2) of said second polarity type (+); and a feedback structure (R1a, C1a, R2a, R2a'; R1b, C1b, R2b, R2b') including first feedback means (R1a, C1a; R1b, C1b) coupled between said output and at least one input terminal (N1; P2) among said plurality (N1, P1; N2, P2) and second feedback means (R2a, R2a'; R2b, R2b') coupled between said one input terminal and a common node (CM), said input signal ($V_{IN}$) being applied to a set of two input terminals (P1, N2) among said plurality and different from said one input terminal (N1; P2), characterized in that said input signal ($V_{IN}$) is applied between said second (P1) and said third (N2) input terminals of opposite polarity types of said first (N1, P1) and second (N2, P2) differential input pairs respectively, in that said output (outp; outn) is a differential output comprising a first output terminal (outp) and a second output terminal (outn), in that said first second feedback means (R1a, C1a; R1b, C1b) comprises a first feedback circuit (R1a, C1a) coupling said first output terminal (outp) to said first input terminal (N1) of said first differential input pair (N1, P1), and a second feedback circuit (R1b, C1b) coupling said second output terminal (outn) to said fourth input terminal (P2) of said second differential input pair (N2, P2), and in that said second feedback means (R2a, R2a'; R2b, R2b') comprises a third feedback circuit (R2a, R2a') coupling said first input terminal (N1) to said common node (CM), and a fourth feedback circuit (R2b, R2b') coupling said fourth input terminal (P2) to said common node (CM).

2. Low noise amplifier structure according to claim 1, characterized in that said structure further includes input common mode adjustment means comprising a second differential difference amplifier (DDA2) and a resistive feedback network (GL1, GH1, GH3, R2a', R2a; GL2, GH2, GH4, R2b, R2b'), in that said second differential difference amplifier (DDA2) has a second differential output (O1; O2) comprising a third output terminal (O1) and a fourth output terminal (O2), and has a second plurality of input terminals (N1', P1';N2', P2') arranged in a third (N1', P1') and in a fourth (N2', P2') differential input pair, said third differential input pair (N1', P1') comprising a fifth input terminal (N1') and a sixth input terminal (P1') of opposite polarity types, and said fourth differential input pair (N2', P2') comprising a seventh input terminal (N2') and an eighth input terminal (P2') of opposite polarity types, in that said sixth (P1') and eighth (P2') input terminals are connected to said second (P1) and third (N2) input terminals respectively of the first mentioned differential difference amplifier (DDA1), and said fifth (N1') and seventh (N2') input terminals are connected to said first (N1 ) and fourth (P2) input terminals respectively of said first differential difference amplifier (DDA1), and in that said resistive feedback network (GL1, GH1, GH3, R2a, R2a'; GL2, GH2, GH4, R2b, R2b') includes said feedback structure (R1a, C1a, R2a, R2a'; R1b, C1b, R2b, R2b') whereof said third feedback circuit (R2a, R2a') and said fourth feedback circuit (R2b, R2b') are resistive means coupling said fifth input terminal (N1') to said seventh input terminal (N2') via said common node (CM), and is adapted to couple said third (O1) and fourth (O2) output terminals of said second differential difference amplifier (DDA2) to said first (N1) and fourth (P2) input terminals respectively of said first differential difference amplifier (DDA1).

3. Low noise amplifier structure according to claim 2 characterized in that said resistive feedback network (GL1, GH1, GH3, R2a, R2a'; GL2, GH2, GH4, R2b, R2b') further includes switching means (GL1, GH1, GH3; GL2, GH2, GH4) adapted to couple said third (O1) and fourth (O2) output terminals of said second differential difference amplifier (DDA2) to said first (N1) and fourth (P2) input terminals of said first differential difference amplifier (DDA1) either directly for a first status of said switching means or via said resistive means (R2a,R2a'; R2b, R2b') for a second status of said switching means.

4. Low noise amplifier structure according to claim 3, characterized in that each of said third (R2a, R2a') and fourth (R2b, R2b') feedback circuits include a same plurality of series connected resistors (R2a, R2a'; R2b, R2b'), and in that said switching means (GL1, GH1, GH3; GL2, GH2, GH4) includes:

a first pair of switches (GL1; GL2) adapted to connect said third (O1) and fourth (O2) output terminals of said second differential difference amplifier (DDA2) to said first (N1) and fourth (P2) input terminals of said first differential difference amplifier (DDA1);

a second pair of switches (GH1; GH2) adapted to connect said third (O1) and fourth (O2) output terminals of said second differential difference amplifier (DDA2) to said common node (CM) of said third (R2a, R2a') and fourth (R2b, R2b') feedback circuits; and at least a third pair of switches (GH3; GH4), each switch (GH3; GH4) of said third pair being connected across a resistor (R2a; R2b) of a distinct one of said resistive means (R2a, R2a'; R2b, R2b').

5. Low noise amplifier structure according to claim 4, characterized in that said first status of said switching means (GL1, GH1, GH3; GL2, GH2, GH4) corresponds to a relatively low gain of said structure for which the switches of said first pair of switches (GL1; GL2) are closed, while the switches of said second (GH1; GH2) and third (GH3; GH4) pairs of switches are open, and in that said second status of said switching means (GL1, GH1, GH3; GL2, GH2, GH4) corresponds to a relatively high gain of said structure for which the switches of said first pair of switches (GL1; GL2) are open, while the switches of said second (GH1; GH2) and third (GH3; GH4) pairs of switches are closed.

6. Low noise amplifier structure according to claim 1, characterized in that said first (N1) and third (N2) input terminals of the first mentioned differential difference amplifier (DDA1) are inverting (−) input terminals, while said second (P1) and fourth (P2) input terminals of said first differential difference amplifier (DDA1) are non-inverting (+) input terminals.

7. Low noise amplifier structure according to claim 2, characterized in that said fifth (N1') and seventh (N2') input terminals of said second differential difference amplifier (DDA2) are inverting (−) input terminals, while said sixth (P1') and eighth (P2') input terminals of said second differential difference amplifier (DDA2) are non-inverting (+) input terminals.

8. Low noise amplifier structure according to claim 1, characterized in that said first (R1a, C1a) and second (R1b, C1b) feedback circuits of said first feedback means (R1a, C1a; R1b, C1b) each are a filter circuit comprising the parallel connection of a resistor (R1a; R1b) and a capacitor (C1a; C1b).

* * * * *

UNITED STATES PATENT AND TRADEMARK OFFICE
CERTIFICATE OF CORRECTION

PATENT NO. : 5,861,778
DATED : January 19, 1999
INVENTOR(S) : F. Louagie et al

It is certified that error appears in the above-identified patent and that said Letters Patent is hereby corrected as shown below:

At column 6, line 13 (claim 1, line 9), please cancel "pl" and substitute therefor --P1--;

at line 39 (claim 1, line 34), after "first", please cancel "second"; and at line 57 (claim 2, line 5), please cancel "R2a', R2a" and substitute therefor --R2a, R2a'--.

Signed and Sealed this

First Day of June, 1999

Attest:

Attesting Officer

Q. TODD DICKINSON

Acting Commissioner of Patents and Trademarks